(12) United States Patent
Voss et al.

(10) Patent No.: US 9,985,017 B2
(45) Date of Patent: May 29, 2018

(54) SEMICONDUCTOR DEVICE COMPRISING A CLAMPING STRUCTURE

(71) Applicant: Infineon Technologies Austria AG, Villach (AT)

(72) Inventors: Stephan Voss, Munich (DE); Roman Baburske, Otterfing (DE); Thomas Basler, Riemerling (DE); Thomas Kimmer, Poertschach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days. days.

(21) Appl. No.: 15/210,640

(22) Filed: Jul. 14, 2016

(65) Prior Publication Data

US 2017/0018544 A1 Jan. 19, 2017

(30) Foreign Application Priority Data

Jul. 15, 2015 (DE) .......................... 10 2015 111 479

(51) Int. Cl.
| | |
|---|---|
| *H01L 29/66* | (2006.01) |
| *H01L 27/02* | (2006.01) |
| *H01L 29/739* | (2006.01) |
| *H01L 25/18* | (2006.01) |
| *H01L 23/495* | (2006.01) |
| *H01L 29/06* | (2006.01) |

(Continued)

(52) U.S. Cl.
CPC ...... *H01L 27/0248* (2013.01); *H01L 23/4952* (2013.01); *H01L 23/49562* (2013.01); *H01L 25/18* (2013.01); *H01L 27/0814* (2013.01); *H01L 29/0615* (2013.01); *H01L 29/0619* (2013.01); *H01L 29/0834* (2013.01); *H01L 29/7395* (2013.01); *H01L 27/0694* (2013.01); *H01L 27/0727* (2013.01); *H01L 29/402* (2013.01); *H01L 29/861* (2013.01); *H01L 2224/48247* (2013.01); *H01L 2224/49113* (2013.01)

(58) Field of Classification Search
CPC ............. H01L 27/0248; H01L 23/4952; H01L 23/49562; H01L 25/18; H01L 29/0615; H01L 29/0619; H01L 29/0834
See application file for complete search history.

(56) References Cited

U.S. PATENT DOCUMENTS

| | | |
|---|---|---|
| 6,353,236 B1 | 3/2002 | Yatsuo et al. |
| 7,514,750 B2 | 4/2009 | Mauder et al. |

(Continued)

FOREIGN PATENT DOCUMENTS

| | | |
|---|---|---|
| DE | 102004047749 B4 | 12/2008 |
| DE | 102010038731 B3 | 12/2011 |

(Continued)

*Primary Examiner* — Elias M Ullah
(74) *Attorney, Agent, or Firm* — Murphy, Bilak & Homiller, PLLC

(57) ABSTRACT

Semiconductor device with a semiconductor body that includes a clamping structure including a pn junction diode and a Schottky junction diode serially connected back to back between a first contact and a second contact. A breakdown voltage of the pn junction diode is greater than 100 V and a breakdown voltage of the Schottky junction diode is greater than 10 V.

32 Claims, 7 Drawing Sheets

(51) Int. Cl.
  *H01L 29/08* (2006.01)
  *H01L 27/08* (2006.01)
  *H01L 29/40* (2006.01)
  *H01L 29/861* (2006.01)
  *H01L 27/06* (2006.01)
  *H01L 27/07* (2006.01)

(56) References Cited

U.S. PATENT DOCUMENTS

2009/0296291 A1 12/2009 Volke
2014/0001549 A1* 1/2014 Bode ................ H01L 29/66659
  257/337

FOREIGN PATENT DOCUMENTS

| DE | 102004007991 B4 | 7/2015 |
| EP | 0566179 A1 | 10/1993 |
| JP | 0715009 A | 1/1995 |
| JP | 2002246610 A | 8/2002 |

* cited by examiner

SEMICONDUCTOR DEVICE COMPRISING A CLAMPING STRUCTURE

PRIORITY CLAIM

This application claims priority to German Patent Application No. 10 2015 111 479.8 filed on 15 Jul. 2015, the content of said application incorporated herein by reference in its entirety.

BACKGROUND

In semiconductor devices, for example power semiconductor devices such as insulated gate bipolar transistors (IGBTs), insulated gate field effect transistors (IGFETs), for example metal oxide semiconductor field effect transistors (MOSFETs), and bipolar junction transistors (BJTs), overvoltages occurring during device operation may damage the semiconductor device or circuit parts in case of insufficient protective measures. By way of example, IGBTs in induction cookers may suffer from overvoltages caused by instabilities of the mains power supply.

It is desirable to provide an overvoltage protection for transistors.

SUMMARY

Embodiments of the present disclosure relates to a semiconductor device comprising a semiconductor body. The semi conductor body comprises a clamping structure including a pn junction diode and a Schottky junction diode serially connected back to back between a first contact and a second contact. A breakdown voltage of the pn junction diode is greater than 100 V and a breakdown voltage of the Schottky junction diode is greater than 10 V.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1:
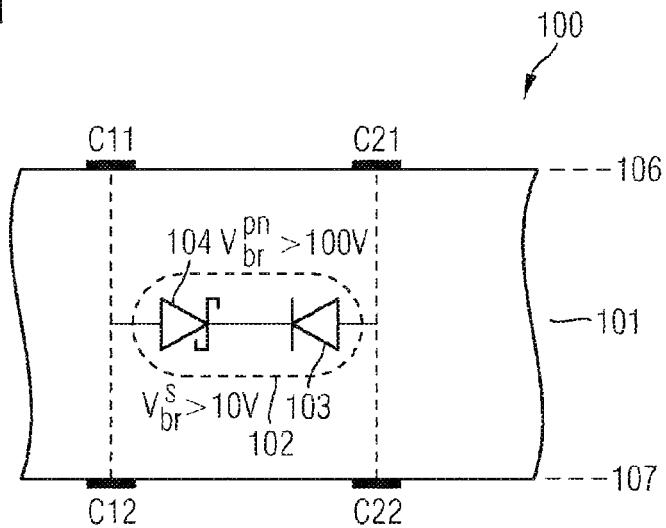
FIG. 1 is a schematic view of a semiconductor device including a clamping structure in a semiconductor body according to an embodiment.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

An embodiment of a semiconductor device is illustrated in the schematic cross-sectional view 100 of FIG. 1.

The semiconductor device comprises a semiconductor body 101 comprising a clamping structure 102 including a pn junction diode 103 and a Schottky junction diode 104 serially connected back to back between a first contact and a second contact. According to an embodiment, the first contact is a first contact C11 at a first surface 106 of the semiconductor body 101, for example a front surface of the semiconductor body 101. According to another embodiment, the first contact is a first contact C12 at a second surface 107, for example a rear surface of the semiconductor body 101. Thus, the first contact may be arranged at the first surface 106 or at the second surface 107. According to an embodiment, the second contact is a second contact C21 at the first surface 106 of the semiconductor body 101. According to another embodiment, the second contact is a second contact C22 at the second surface 107 of the semiconductor body 101. Thus, the second contact may be arranged at the first surface 106 or at the second surface 107. The first and second contacts may be arranged at a same surface of the semiconductor body 101, for example at the first surface 106 or at the second surface 107, or may be arranged at opposite surfaces.

A breakdown voltage $V_{ba}^{pn}$ of the pn junction diode 103 is greater than 100 V, or greater than 200V, or greater than 600V and a breakdown voltage $V_{ba}^{S}$ of the Schottky junction diode 104 is greater than 10 V, or greater than 15V, or greater than 20V. Thus, overvoltage protection of high-voltage transistors may be achieved by electrical breakdown of the pn junction diode 103 before destructive or damaging electrical breakdown between load terminals of the high-voltage transistor may occur. The breakdown voltage $V_{ba}^{S}$ of the Schottky junction diode may be chosen large enough for blocking a positive gate voltage versus the second load terminal, for example. The Schottky junction diode 104 may be replaced by a second pn junction diode having a breakdown voltage in a same range as the Schottky junction diode 104. The pn junction diode 103 and the second pn junction diode may be connected back to back having anodes connected together or having cathodes connected together.

Integration of the Schottky junction diode 104 and the pn junction diode 103 into a single semiconductor die, for example the semiconductor body 101 illustrated in FIG. 1 provides a clamping structure with reduced wiring effort and tailored breakdown voltage of the pn junction diode 103. A clamping structure having diodes integrated in separate dies connected back to back by additional wirings, for example bond wires, may suffer from parasitic inductances. Moreover, the breakdown voltage $V_{ba}^{pn}$ may be adjusted to a desired value for securing a protection function with regard to a device to be protected, for example a drain to source path of a transistor. The breakdown voltage $V_{ba}^{pn}$ of the pn junction diode 103 may be adjusted by appropriately setting a doping concentration and a thickness of a voltage absorbing region within the semiconductor body 101. The voltage absorbing region may correspond to a part of the semiconductor body 101 having an initial doping concentration of a semiconductor substrate or an epitaxial layer formed thereon, for example.

In some embodiments, the pn junction diode 103 and the Schottky junction diode 104 share at least one semiconductor region of the semiconductor body 101.

In some embodiments, the pn junction diode 103 is a single pn junction diode.

Figure 2A:
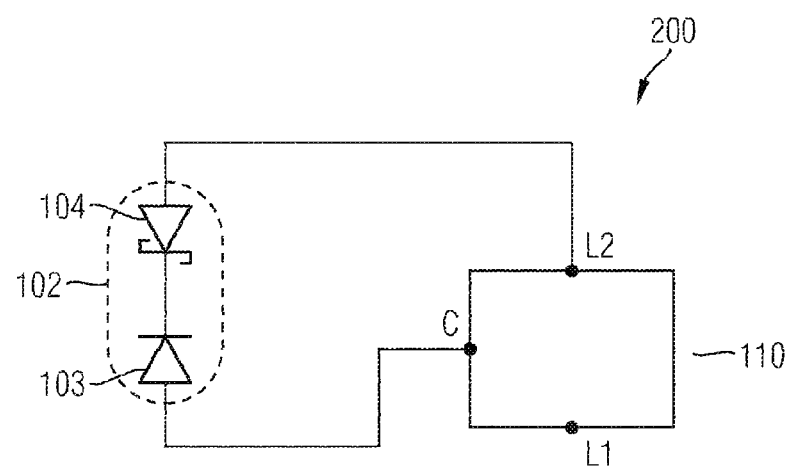
FIG. 2A is a schematic view of a semiconductor device including the clamping structure of FIG. 1 connected in parallel between a load terminal and a control terminal of a transistor.

Another embodiment of a semiconductor device is illustrated in the schematic view 200 of FIG. 2A.

The semiconductor device illustrated in FIG. 2A further comprises a power transistor 110 including first and second load terminals L1, L2 and a control terminal C. The clamping structure 102 is electrically connected between the control terminal C and the second load terminal L2. The second load terminal L2 may be a drain terminal of an IGFET, or a collector terminal of an IGBT, or a collector terminal of a BJT, for example. The control terminal C may be a gate terminal of an IGFET, a gate terminal of an IGBT, or a base terminal of a BJT. The first terminal L1 corresponds to a source terminal of an IGFET, an emitter terminal of an IGBT, or an emitter terminal of a BJT, for example.

Figure 2B:
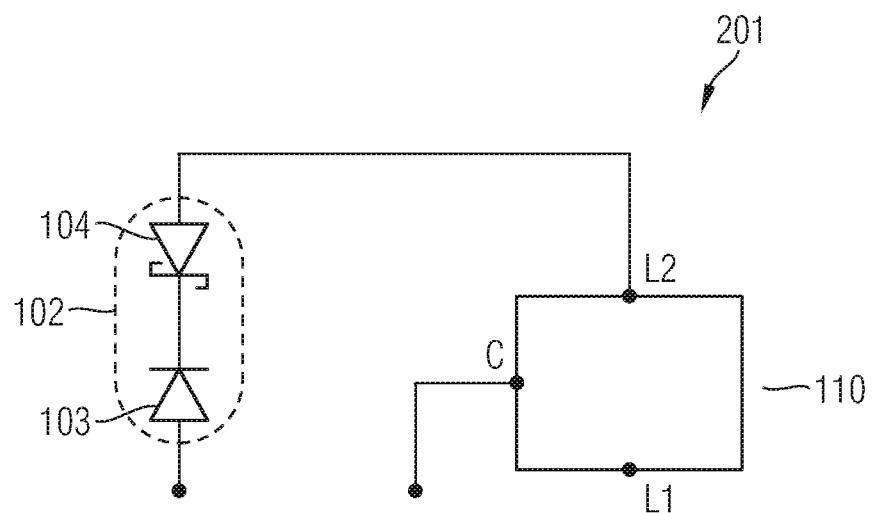
FIG. 2B is a schematic view of a semiconductor device including the clamping structure of FIG. 1 connected to a load terminal of a transistor.

Yet another embodiment of a semiconductor device is illustrated in the schematic view 201 of FIG. 2B. The semiconductor device of FIG. 2B differs from the embodiment illustrated in FIG. 2A in that the control terminal C of the power transistor 110 and the clamping structure 102 are disconnected, thereby allowing for an external connection as described with reference to FIG. 4 below, for example.

In some embodiments, the pn junction diode 103 and the Schottky junction diode 104 serially connected back to back constitute a discrete semiconductor clamping device in a semiconductor package.

Figure 3:
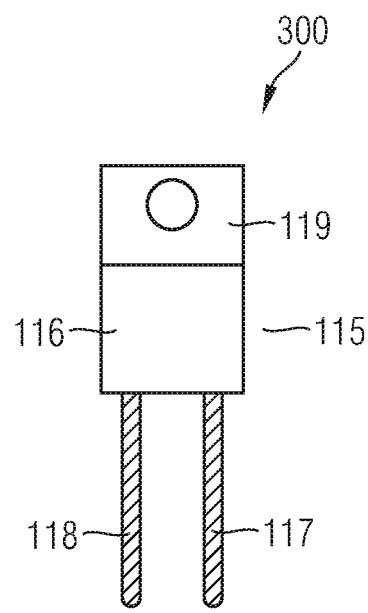
FIG. 3 is a schematic illustrating of a small pin count package accommodating the clamping structure of FIG. 1 as a discrete semiconductor device.

An embodiment of a transistor outline (TO) package 115 including a clamping structure, for example the clamping structure 102 illustrated in FIG. 1 as a discrete semiconductor device is illustrated in the schematic view 300 of FIG. 3.

The clamping structure included in the TO package 115 is surrounded by a molding compound 116. The TO package 115 includes first and second leads 117, 118 and a metal frame 119. In some embodiments, the metal frame 119 may be electrically isolated from a semiconductor die of the clamping structure by an internal ceramic-insulator mounted there between. In some embodiments, the metal frame 119 and one of the first and second leads 117, 118 may be electrically connected and/or formed of a continuous structure. The first lead 117 may be electrically connected to one of the pn junction diode 103 and the Schottky junction diode 104 of the clamping structure 102 illustrated in FIG. 1. The second lead 118 may be electrically connected to the other one of the pn junction diode 103 and the Schottky junction diode 104 of the clamping structure 102 illustrated in FIG. 1.

The TO package 115 illustrated in FIG. 3 is one example of a small pin count package that may be used for packaging the semiconductor body 101 including the clamping structure 102 of FIG. 1. As there exists a wide range of small pin count packages, also other packages may be used for packaging a discrete semiconductor clamping device.

In some embodiments, the power transistor is a discrete power transistor, and the power transistor and the clamping structure are formed in different semiconductor dies.

In some embodiments, the different semiconductor dies are mounted on a common lead frame.

In some embodiments, the clamping structure and the power transistor are included in a single chip package. A control pin of the chip package may be electrically connected to a control terminal of the power transistor by a first bond wire, and the control pin of the chip package may also be electrically connected to the pn junction diode of the clamping structure by a second bond wire.

Figure 4:
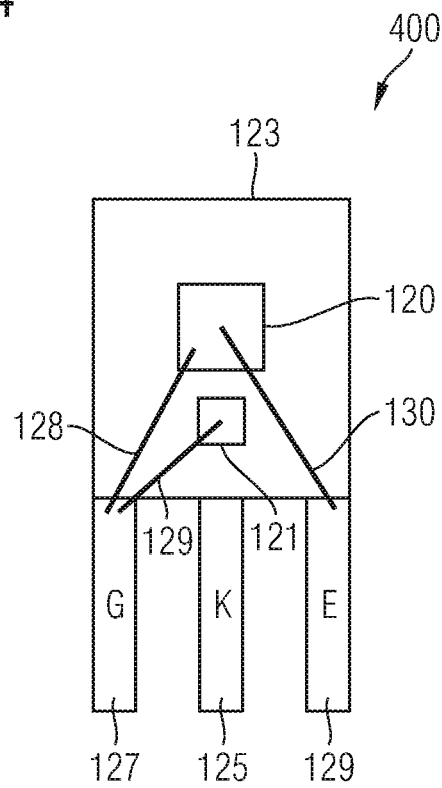
FIG. 4 is a schematic top view of an embodiment of a semiconductor device including the clamping structure of FIG. 1 and the transistor in separate semiconductor dies mounted on a lead frame of a chip package.

An embodiment of a semiconductor device including the clamping structure and the power transistor in a single chip package is illustrated in the schematic top view 400 of FIG. 4.

A first semiconductor die 120 includes the power transistor, for example the power transistor 110 illustrated in FIG. 2A. A separate, second semiconductor die 121 includes the clamping structure, for example the clamping structure 102 illustrated in FIGS. 1 and 2A.

Both the clamping structure and the power transistor are electrically connected to a lead frame 123 via a rear side of the first and second semiconductor dies 120, 121, respectively. According to an embodiment, a second load terminal of the power transistor, for example a collector of an IGBT or a collector of a BJT or a drain of an IGFET is electrically connected to the lead frame 123 via the rear side of the first semiconductor die 120. An anode of the Schottky junction diode of the clamping structure may also be electrically connected to the lead frame 123 via the rear side of the second semiconductor die 121. The lead frame 123 is electrically connected to a second load pin 125. A control terminal of the power transistor, for example a gate of an IGBT or a gate of an IGFET or a base of a BJT is electrically connected to a control pin 127 via a first bond wire 128 at a front surface of the first semiconductor die 120. An anode of the pn junction diode of the clamping structure is electrically connected to the control pin 127 via a second bond wire 129 at a front surface of the second semiconductor die 121. A first load terminal of the power transistor, for example an emitter of an IGBT or an emitter of a BJT or a source of an IGFET is electrically connected to a first load pin 129 via a third bond wire 130 at a front surface of the first semiconductor die 120.

Apart from placing a single bond wire between a chip package pin and one of the first and second semiconductor dies 120, 121, also two, three, four or even more bond wires may be connected in parallel, for example dependent on a current capacity of the bond wire and/or maximum ratings of current flow through the bond wire(s).

The chip package may be any kind of suitable small pin count package, for example a TO package such as TO-247. As there exists a wide range of small pin count packages, also other packages may be used.

According to another embodiment of a semiconductor device, the clamping structure and the power transistor may be integrated in a single chip package similar to the schematic top view 400 of FIG. 4, but one additional pin may be used to electrically connect the first bond wire 128 and the second bond wire 129 to different pins of the package, thereby allowing for an external connection of the control terminal of the power transistor and the clamping structure, for example. The external connection may be via a gate driver and/or printed circuit board (PCB), for example.

In some embodiments, the power transistor and the clamping structure are integrated in a same semiconductor body, i.e. the power transistor and the clamping structure are formed in a single semiconductor die. By way of example, the power transistor 110 illustrated in FIGS. 2A, 2B may also be formed in the semiconductor body 101 of the clamping structure 102 of illustrated in FIG. 1.

In some embodiments, a drift zone of the power transistor, a cathode region of the Schottky junction diode and a cathode region of the pn junction diode are formed in a same semiconductor region. In some embodiments, the same semiconductor region is a lightly doped or almost intrinsic semiconductor part of a semiconductor substrate such as a Czochralski (CZ) or magnetic Czochralski (MCZ) or float-zone (FZ) silicon substrate or an epitaxial layer formed thereon.

In some embodiments, a breakdown voltage between the first and second load terminals of the power transistor is greater than a breakdown voltage of the clamping structure connected in parallel between the second load terminal and the control terminal.

In some embodiments, the second contact is at a first surface of the semiconductor body and is electrically connected to the pn junction diode, the first contact is at a second surface of the semiconductor body opposite to the first surface and constitutes a Schottky contact metal of the Schottky junction diode.

In some embodiments, the semiconductor device further comprises a field stop zone between the Schottky contact metal and a part of the semiconductor body, the field stop zone directly adjoining the Schottky contact metal and comprising a doping concentration greater than the part of the semiconductor body. In some embodiments, the part of the semiconductor body includes a doping concentration in the range of $5 \times 10^{12}$ cm$^{-3}$ and $2 \times 10^{14}$ cm$^{-3}$, wherein a thickness of the part of the semiconductor body between opposite surfaces of the semiconductor body is greater than 10 μm, or greater than 20 μm, or greater than 30 μm, or greater than 40 μm, or even greater than 50 μm. In some embodiments, the part of the semiconductor body constitutes a cathode region of the pn junction diode of the clamping structure.

In some embodiments, the semiconductor device further comprises an anode region of the pn junction diode directly adjoining a first surface of the semiconductor body at the first surface, the anode region being electrically connected to the first contact. In some embodiments, an edge termination structure surrounds the anode region at the first side. The purpose of the edge termination structure is to reduce the electric field peak at the periphery of the anode region. Typical structural elements of edge termination structures include one or more of field plates, ring structures such as floating guard rings or ring segments, junction termination extension (JTE) structures and variation of lateral doping (VLD) structures, for example. A doping concentration of a p-doped junction termination extension (JTE) may be smaller than the doping concentration of the anode region.

Figure 5:
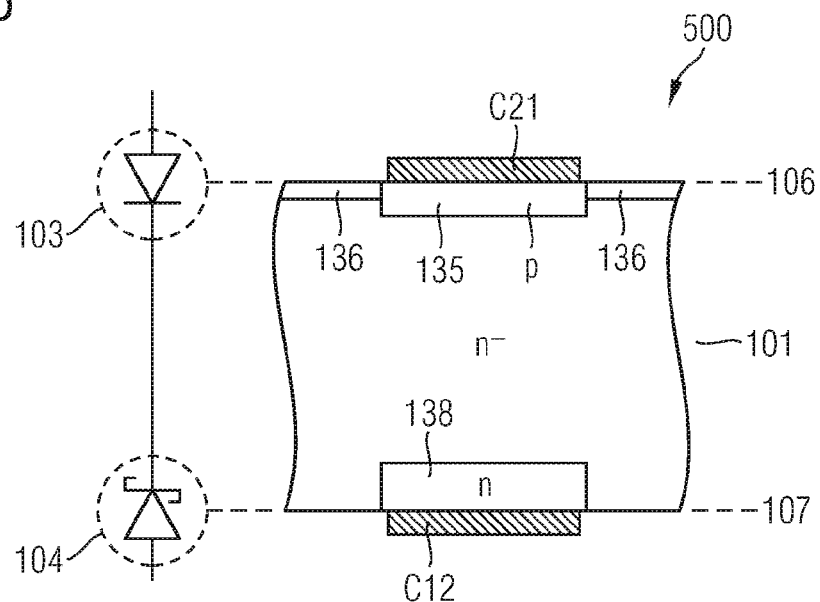
FIGS. 5 to 9 are schematic cross-sectional views of a semiconductor body for illustrating different embodiments of the clamping structure of FIG. 1.

An embodiment of a clamping structure in the semiconductor body 101 is illustrated in the schematic cross-sectional view 500 of FIG. 5.

The semiconductor body 101 may be lightly n-doped. The doping concentration may range between of $5 \times 10^{12}$ cm$^{-3}$ and $2 \times 10^{14}$ cm$^{-3}$, for example. The lightly n-doped semiconductor body 101 may correspond to a lightly n-doped semiconductor substrate or a lightly n-doped epitaxial layer on a semiconductor substrate, for example. A p-doped anode region 135 at the first surface 106 of the semiconductor body 101 is electrically connected to the second load contact C21. An edge termination structure 136 surrounds the anode region 135 at the first surface 106 and is configured to reduce the electric field peak at the periphery of the anode region 135. The edge termination structure may include one or more of field plates, ring structures such as floating guard rings or ring segments, junction termination extension (JTE) structures and variation of lateral doping (VLD) structures, for example. In some embodiments, the edge termination structure 136 is a p$^-$-doped JTE region surrounding the anode region 135 at the first surface 106. The p$^-$-doped JTE region surrounding the anode region 135 at the first surface 106 allows to concentrate an area of electrical breakdown within the anode region 135, thereby counteracting undesired local breakdown in edge regions of the pn junction diode 103.

A Schottky junction of the Schottky junction diode 104 is formed between an n-doped field stop zone 138 at the second surface 107 of the semiconductor body 101 and a Schottky contact metal at the second surface 107. The Schottky contact metal at the second surface 107 constitutes the first load contact C12. A cathode region of the Schottky junction diode 104 is formed by the n-doped field stop zone 138 and the lightly n-doped semiconductor body 101. Thus, the pn junction diode 103 and the Schottky junction diode 104 share a part of the lightly n-doped semiconductor body 101 and the n-doped field stop zone 138 as a common cathode region. The breakdown voltage $V_{br}^{pn}$ of the pn junction diode 103 may be adjusted greater than 100 V, or greater than 200V or greater than 600V by appropriately selecting the doping concentration of the semiconductor body 101 and a thickness of the semiconductor body 101 between the anode region 135 and the field stop zone 138, for example. The breakdown voltage $V_{br}^{S}$ of the Schottky junction diode 104 may be adjusted greater than 10 V, or greater than 5V or even greater than 20V by appropriately selecting the Schottky contact metal, a doping concentration and a thickness of the field stop zone 138, for example.

Figure 6:
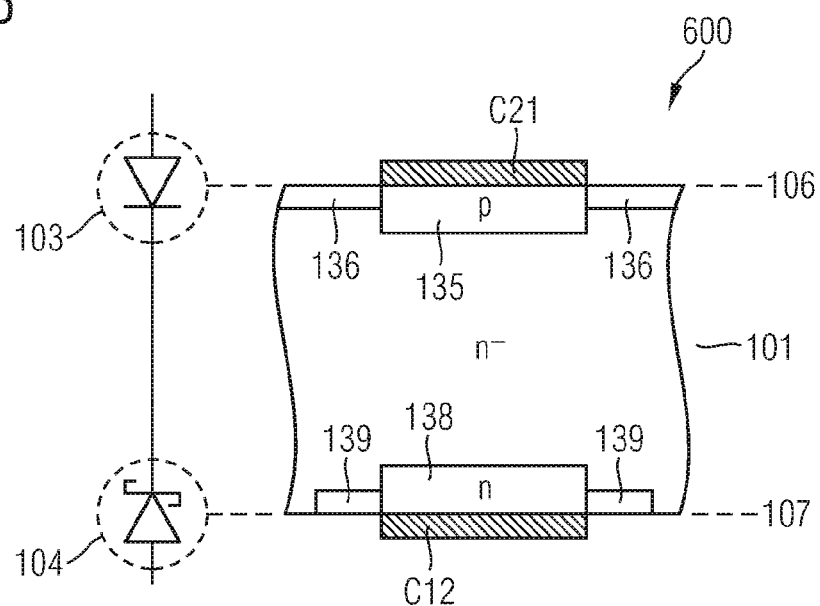

Another embodiment of a clamping structure in the semiconductor body 101 is illustrated in the schematic cross-sectional view 600 of FIG. 6. The explanations and information in regard to the cross-sectional view 500 of FIG. 5 also apply to the cross-sectional view 600. The following explanations address differences with respect to the cross-sectional view 500.

In the cross-sectional view 600, the clamping structure not only includes the edge termination structure 136 surrounding the anode region 135 at the first surface 106, but in addition includes a second n-doped field stop zone 139 surrounding the field stop zone 138 at the second surface 107. The Schottky contact metal of the first contact C12 directly adjoins the n-doped field stop zone 138, but is absent or may only partly cover the second field stop zone 139.

A vertical extension of the field stop zone 138 into the semiconductor body 101 from the second surface 107 is greater than a vertical extension of the second field stop zone 139 into the semiconductor body 101 from the second surface 107. By way of example, the field stop zone 138 and the second field stop zone 139 may be formed by a two-stage diffusion process of donors, for example selenium and/or phosphorus, or by a two-stage proton implantation process from the second surface 107. Proton implantation and annealing allows to form hydrogen-related donors within the semiconductor body 101. When applying a mask at the second surface 107 of the semiconductor body 101 including a mask opening congruent with an area where the field stop zone 138 is to be formed, a single stage diffusion and/or proton implantation process may be used to form the field stop zone 138 and the second field stop zone 139. The field stop zone 138 and the second field stop zone 139 may also be formed by proton implantation through and from the first surface 106 using the second contact C21 at the first surface 106 as an irradiation mask for forming a step between the field stop zone 138 and the second field stop zone 139. In some embodiments, a doping concentration of the second field stop zone 139 is smaller than a doping concentration of the field stop zone 138.

Figure 7:
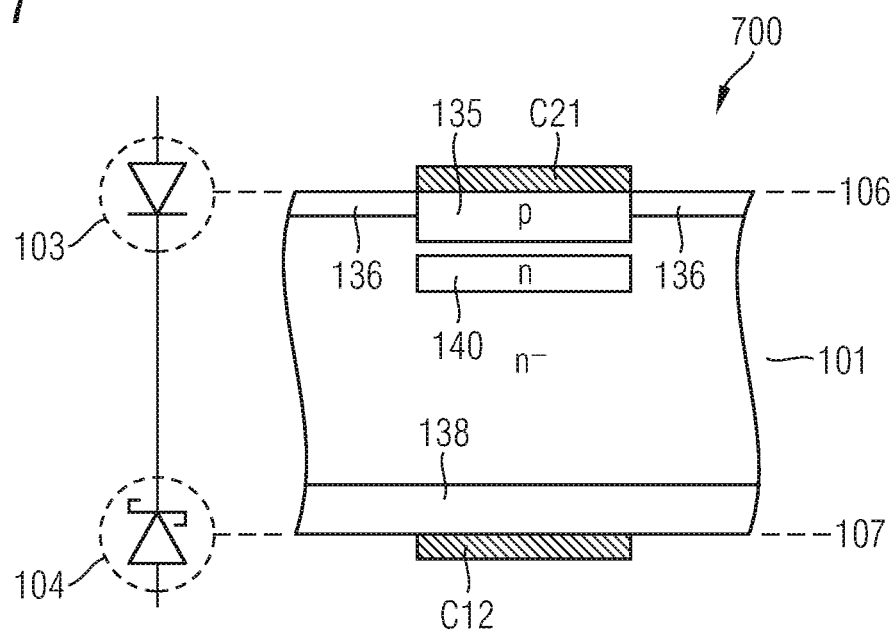

Another embodiment of a clamping structure in the semiconductor body 101 is illustrated in the schematic cross-sectional view 700 of FIG. 7. The explanations and information in regard to the cross-sectional view 500 of FIG. 5 also apply to the cross-sectional view 700. The following explanations address differences with respect to the cross-sectional view 500.

The clamping structure further includes an n-doped buried field stop zone 140 located in the semiconductor body 101 at a vertical distance from the field stop zone 138. The buried field stop zone 140 is also located at a vertical distance from the anode region 135 and may be formed by proton irradiation, for example. The field stop zone 138 extends into an edge region, i.e. beyond and area congruent with the Schottky contact metal at the second surface 107. According to an embodiment, the field stop zone 138 may be formed by an unmasked diffusion or ion implantation process through the second surface.

Figure 8:
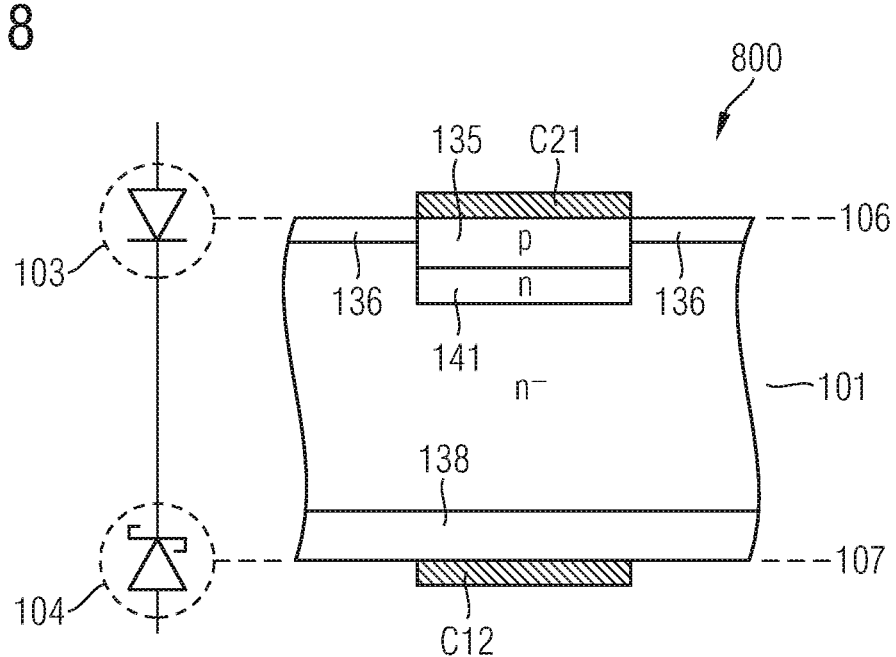

Another embodiment of a clamping structure in the semiconductor body 101 is illustrated in the schematic cross-sectional view 800 of FIG. 8. The explanations and information in regard to the cross-sectional view 500 of FIG. 5 also apply to the cross-sectional view 800. The following explanations address differences with respect to the cross-sectional view 500.

The clamping structure further includes an n-doped buried field stop zone 141 located in the semiconductor body 101 at a vertical distance from the field stop zone 138. The buried field stop zone 140 is directly adjacent to the anode region 135. The field stop zone 138 extends into an edge region, i.e. beyond and area congruent with the Schottky contact metal at the second surface 107. According to an embodiment, the field stop zone 138 may be formed by an unmasked diffusion or ion implantation process through the second surface.

Provision of the second field stop zone 139 and the buried field stop zones 140, 141 allows to locally clamp the electric breakdown and, thus, to counteract indefinite local breakdown that may be distributed due to process variations.

Figure 9:
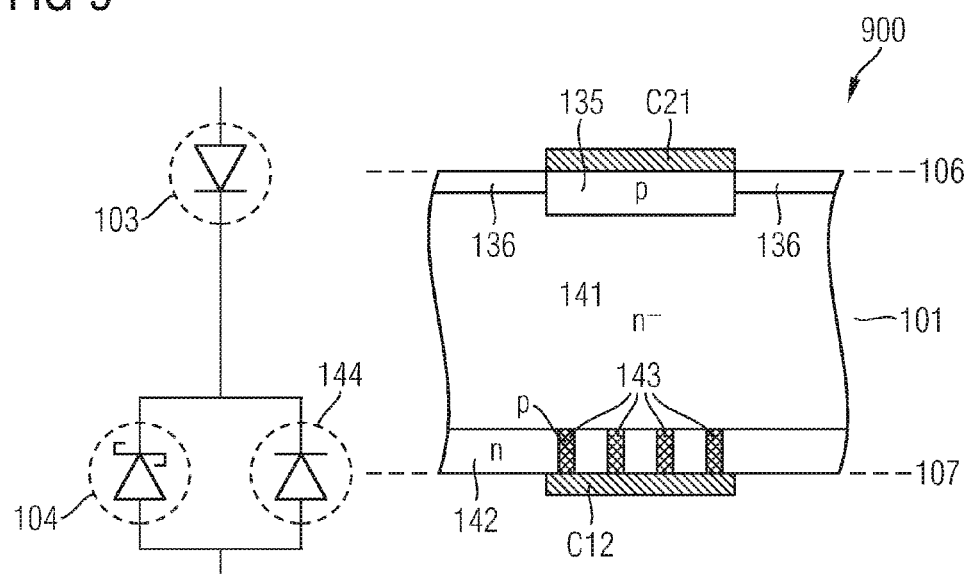

Another embodiment of a clamping structure in the semiconductor body 101 is illustrated in the schematic cross-sectional view 900 of FIG. 9. The explanations and information in regard to the cross-sectional view 500 of FIG. 5 also apply to the cross-sectional view 900. The following explanations address differences with respect to the cross-sectional view 500.

A field stop zone 142 extends into an edge region, i.e. beyond and area congruent with the Schottky contact metal at the second surface 107. According to an embodiment, the field stop zone 142 may be formed by an unmasked diffusion or ion implantation process through the second surface. The field stop zone 142 at the second surface 107 is interrupted by p-doped regions 143 sandwiched between lightly n-doped semiconductor body 101 and the Schottky contact metal C12. The p-doped regions 143 and the lightly n-doped semiconductor body 101 constitute a second pn junction diode 144 connected in parallel to the Schottky junction diode 104. Provision of the p-doped regions 143, and thus of the second pn junction diode 144 allows to reduce a breakdown voltage $V_{br}^{pn}$ of the pn junction diode 103. In some embodiments, the p-doped regions 143 end within the field stop zone 142, i.e. an extension of the p-doped regions 143 into the n-doped semiconductor body 101 is smaller than an extension of the field stop zone 142 into the n-doped semiconductor body 101. Moreover, a degree of freedom when adjusting electrical characteristics such as voltage blocking capabilities at the second surface 107 defined by the parallel connection of the Schottky junction diode 104 and the second pn junction diode 144 may be increased.

Figure 10:
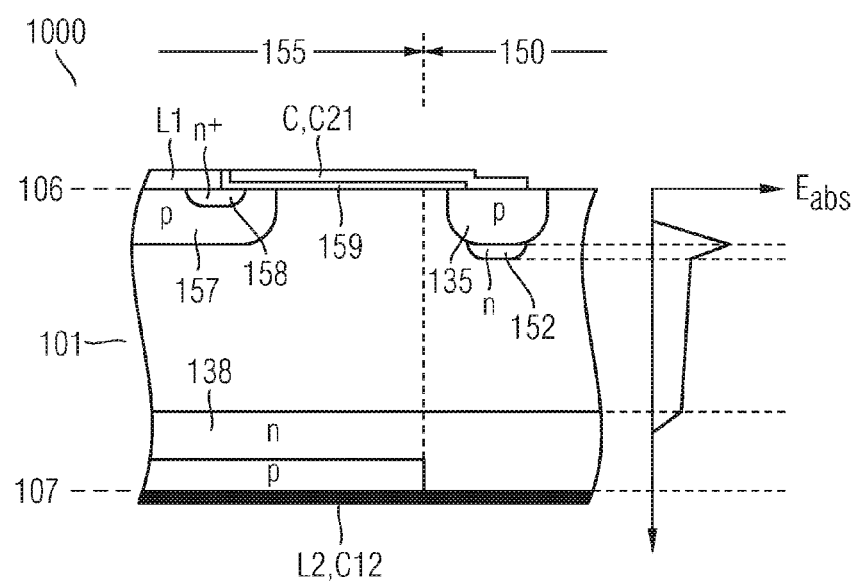
FIG. 10 is a schematic cross-sectional illustrating an embodiment of a clamping structure and an IGBT integrated into a single semiconductor body.

FIG. 10 is a schematic cross-sectional view 1000 illustrating an embodiment of a clamping structure and an IGBT integrated into a single semiconductor body.

The semiconductor body 101 includes, in a clamping structure area 150, the clamping structure comprising a Schottky junction diode at the second surface 107, the Schottky junction diode including the first contact C12 at the second surface 107 constituting a Schottky contact metal forming a Schottky junction at an interface to the field stop zone 138 in the clamping structure area 150. The clamping structure further includes a pn junction diode at the first surface 106, the pn junction diode being formed by the anode region 135 and the lightly n-doped semiconductor body 101. An n-doped breakdown adjustment region 152 includes a doping concentration greater than the lightly n-doped semiconductor body 101 for securing that the breakdown voltage $V_{br}^{pn}$ of the pn junction diode of the clamping structure is smaller than a breakdown voltage between the load terminals, i.e. collector and emitter of the IGBT. The anode region 135 is electrically connected to second contact C21 at the first surface 106. In some other embodiments, the n-doped breakdown adjustment region 152 may be replaced by a p⁺-doped breakdown adjustment region, for example.

The semiconductor body 101 further includes, in an IGBT area 155, a p-doped rear side emitter region 156 at the second surface 107. The p-doped rear side emitter region 156 is arranged between the n-doped field stop zone 138 and a contact at the second surface 107 constituting the load terminal L2 of the IGBT in the IGBT area 155. The load terminal L2 in the IGBT area 155 and the second contact C21 in the clamping structure area 150 may be jointly formed, for example. A p-doped body region 157 and an n⁺-doped source region 158 at the first surface 106 are electrically connected to a contact of the first load terminal L1 at the first surface 106. A gate electrode constituting the control terminal C is electrically separated from the semiconductor body 101 by a gate dielectric 159. The gate electrode of the IGBT in the IGBT area 155 and the second contact C21 of the clamping structure in the clamping structure area 150 may be jointly formed, for example.

An electric field profile in a blocking mode of the IGBT having a turned-off gate is illustrated next to the cross-sectional view 1000. An absolute value of the electric field, $E_{abs}$, is illustrated along a depth of a center of the clamping structure. A peak of the electric field is at an interface between the anode region 135 and the n-doped breakdown adjustment region 152. Since a doping concentration of the n-doped breakdown adjustment region 152 and of the n-doped field stop zone 138 is greater than in the lightly n-doped semiconductor body 101, the electric field decreases stronger per unit length along the vertical direction in the n-doped breakdown adjustment region 152 and in the n-doped field stop zone 138 than in the lightly n-doped semiconductor body 101

The power transistor illustrated in FIG. 10 is an IGBT protected by a clamping structure with regard to overvoltage. Other power transistors, for example lateral or vertical IGFETs, lateral or vertical BJTs may also be integrated with the clamping structure into a single semiconductor die according to other embodiments.

The clamping structure and the IGBT may be integrated in a small pin count package, for example a 3 pin package such as a TO package, for example.

Figure 11:
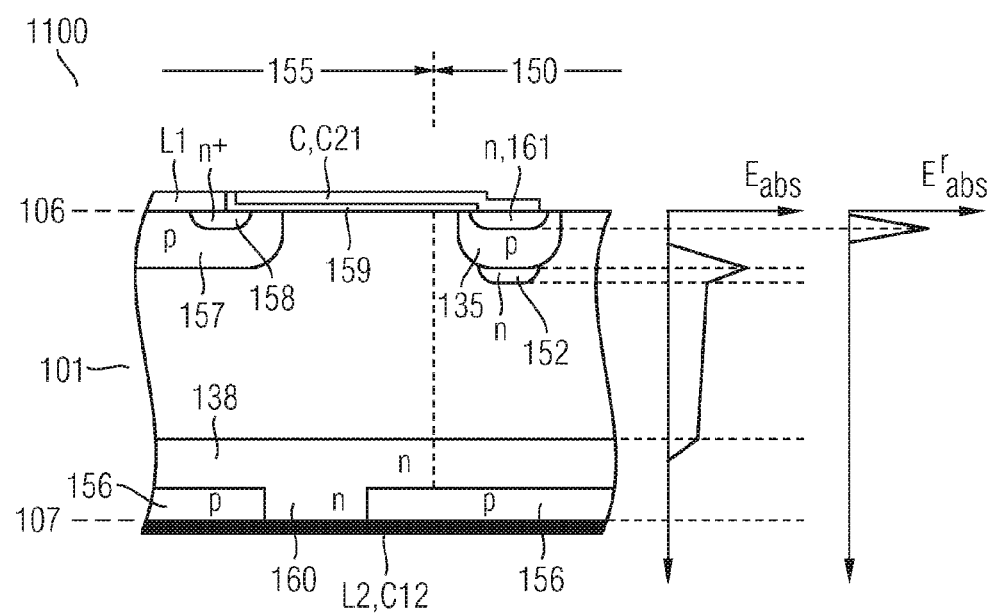
FIG. 11 is a schematic cross-sectional illustrating a clamping structure and a reverse conducting (RC) IGBT integrated into a single semiconductor body.

FIG. 11 is a schematic cross-sectional view 1100 illustrating a clamping structure and a reverse conducting (RC) IGBT integrated into a single semiconductor body.

Reverse conductivity of the RC IGBT is achieved by electrically connecting the n-doped field stop zone 138 to the first contact C12 via n-doped short region(s) 160.

The semiconductor body 101 further includes, in the clamping structure area 150, an n-doped region 161 between the anode region 135 and the second contact C21. The anode region 135 and the n-doped region 161 constitute a pn junction. The breakdown voltage of the pn junction may be chosen large enough for blocking a positive gate voltage versus the second load terminal L2, for example. The pn junction formed by The anode region 135 and the n-doped region 161 is one example of a second pn junction diode replacing the Schottky junction diode of FIG. 1.

An electric field profile at a gate to source voltage that is greater than a threshold voltage and at a gate to source voltage that is greater than a saturation voltage between collector and emitter is illustrated next to profile $E_{abs}$. An absolute value of the electric field, $E_{abs}^{r}$, is illustrated along a depth of a center of the clamping structure. A peak of the electric field is at an interface between the n-doped region 161 and the anode region 135.

The power transistor illustrated in FIG. 11 is a RC IGBT protected by a clamping structure with regard to overvoltage. Other power transistors, for example lateral or vertical IGFETs, lateral or vertical BJT's may also be integrated with the clamping structure into a single semiconductor die according to other embodiments.

The clamping structure and the IGBT may be integrated in a small pin count package, for example a 3 pin package such as a TO package, for example.

Although semiconductor regions provided for similar purpose in the different embodiments described herein may be denoted by same reference numerals, dimensions and doping concentrations may differ between the different embodiments.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body comprising a clamping structure including a pn junction diode and a Schottky junction diode serially connected back to back between a first contact and a second contact, wherein a breakdown voltage of the pn junction diode is greater than 100 V and a breakdown voltage of the Schottky junction diode is greater than 10 V, and
   a power transistor including first and second load terminals and a control terminal, wherein the clamping structure is electrically connected between the control terminal and the second load terminal, the second load terminal being a drain contact of an insulated gate field effect transistor, a collector contact of an insulated gate bipolar transistor, or a collector contact of a bipolar junction transistor, the control terminal being a corresponding contact of a gate of an insulated gate field effect transistor, a gate of an insulated gate bipolar transistor, or a base of a bipolar junction transistor.

2. The semiconductor device of claim 1, wherein the pn junction diode and the Schottky junction diode share at least one semiconductor region of the semiconductor body.

3. The semiconductor device of claim 1, wherein the pn junction diode electrically connected between the Schottky junction diode and one of the first and second contacts is a single pn junction diode.

4. The semiconductor device of claim 1, wherein the pn junction diode and the Schottky junction diode serially connected back to back form a discrete semiconductor clamping device in a semiconductor package.

5. The semiconductor device of claim 1, wherein the power transistor is a discrete power transistor, the power transistor and the clamping structure being formed in different semiconductor dies.

6. The semiconductor device of claim 5, wherein the different semiconductor dies are mounted on a common lead frame.

7. The semiconductor device of claim 6, wherein the clamping structure and the power transistor are included in a single chip package, a control pin of the chip package being electrically connected to a control terminal contact area of the power transistor by a first bond wire, and the control pin of the chip package being electrically connected to the pn junction diode of the clamping structure by a second bond wire.

8. The semiconductor device of claim 6, wherein a drift zone of the power transistor, a cathode region of the Schottky junction diode and a cathode region of the pn junction diode are formed in a same semiconductor region.

9. The semiconductor device of claim 8, wherein a breakdown voltage between first and second load terminals of the power transistor is greater than a breakdown voltage of the clamping structure connected in parallel to the second load terminal and the control terminal.

10. The semiconductor device of claim 1, wherein the power transistor and the clamping structure are integrated in the semiconductor body.

11. The semiconductor device of claim 1, wherein the second contact is at a first surface of the semiconductor body and is electrically connected to the pn junction diode, the first contact is at a second surface of the semiconductor body opposite to the first surface and forms a Schottky contact metal of the Schottky junction diode.

12. The semiconductor device of claim 11, further comprising:
   a field stop zone between the Schottky contact metal and a part of the semiconductor body, the field stop zone directly adjoining the Schottky contact metal and comprising a doping concentration greater than the part of the semiconductor body.

13. The semiconductor device of claim 12, wherein the part of the semiconductor body has a doping concentration in the range of $5 \times 10^{12}$ cm$^{-3}$ and $2 \times 10^{14}$ cm$^{-3}$, and wherein a thickness of the part of the semiconductor body between opposite surfaces of the semiconductor body is greater than 50 μm.

14. The semiconductor device of claim 13, wherein the part of the semiconductor body forms a cathode region of the pn junction diode of the clamping structure.

15. The semiconductor device of claim 14, further comprising:
an anode region of the pn junction diode directly adjoining a first surface of the semiconductor body, the anode region being electrically connected to the first contact.

16. The semiconductor device of claim 15, further comprising:
an edge termination structure surrounding the anode region at the first surface.

17. The semiconductor device of claim 16, wherein the edge termination structure includes one or more of:
field plates, ring structures, junction termination extension structures and variation of lateral doping structures.

18. The semiconductor device of claim 17, further comprising:
a buried field stop zone located in the semiconductor body at a vertical distance from the field stop zone.

19. The semiconductor device of claim 18, wherein the buried field stop zone is located at a vertical distance from the anode region.

20. The semiconductor device of claim 18, wherein the buried field stop zone directly adjoins the anode region.

21. The semiconductor device of claim 1, further comprising:
a second pn junction diode electrically connected in parallel with the Schottky junction diode.

22. A semiconductor device, comprising:
a semiconductor body comprising a clamping structure including a pn junction diode and a Schottky junction diode serially connected back to back between a first contact and a second contact, wherein a breakdown voltage of the pn junction diode is greater than 100 V and a breakdown voltage of the Schottky junction diode is greater than 10 V,
wherein the second contact is at a first surface of the semiconductor body and is electrically connected to the pn junction diode, the first contact is at a second surface of the semiconductor body opposite to the first surface and forms a Schottky contact metal of the Schottky junction diode.

23. The semiconductor device of claim 22, further comprising:
a field stop zone between the Schottky contact metal and a part of the semiconductor body, the field stop zone directly adjoining the Schottky contact metal and comprising a doping concentration greater than the part of the semiconductor body.

24. The semiconductor device of claim 23, wherein the part of the semiconductor body has a doping concentration in the range of $5\times10^{12}$ cm$^{-3}$ and $2\times10^{14}$ cm$^{-3}$, and wherein a thickness of the part of the semiconductor body between opposite surfaces of the semiconductor body is greater than 50 μm.

25. The semiconductor device of claim 24, wherein the part of the semiconductor body forms a cathode region of the pn junction diode of the clamping structure.

26. The semiconductor device of claim 25, further comprising:
an anode region of the pn junction diode directly adjoining a first surface of the semiconductor body, the anode region being electrically connected to the first contact.

27. The semiconductor device of claim 26, further comprising:
an edge termination structure surrounding the anode region at the first surface.

28. The semiconductor device of claim 27, wherein the edge termination structure includes one or more of:
field plates, ring structures, junction termination extension structures and variation of lateral doping structures.

29. The semiconductor device of claim 28, further comprising:
a buried field stop zone located in the semiconductor body at a vertical distance from the field stop zone.

30. The semiconductor device of claim 29, wherein the buried field stop zone is located at a vertical distance from the anode region.

31. The semiconductor device of claim 29, wherein the buried field stop zone directly adjoins the anode region.

32. The semiconductor device of claim 22, further comprising:
a second pn junction diode electrically connected in parallel with the Schottky junction diode.

* * * * *